United States Patent
Kwak et al.

(10) Patent No.: US 9,893,314 B2
(45) Date of Patent: Feb. 13, 2018

(54) DISPLAY DEVICE

(71) Applicant: Samsung Display Co., Ltd., Yongin-si, Gyeonggi-do (KR)

(72) Inventors: Jin Ho Kwak, Yongin-si (KR); Young Seo Choi, Yongin-si (KR); Dong Won Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/176,043

(22) Filed: Jun. 7, 2016

(65) Prior Publication Data

US 2017/0047545 A1 Feb. 16, 2017

(30) Foreign Application Priority Data

Aug. 12, 2015 (KR) .......................... 10-2015-0113890

(51) Int. Cl.
*H01L 51/52* (2006.01)
*H01L 27/32* (2006.01)

(52) U.S. Cl.
CPC ...... *H01L 51/5253* (2013.01); *H01L 27/3244* (2013.01); *H01L 51/5237* (2013.01); *H01L 51/5246* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2007/0040972 A1* | 2/2007 | Lee | G02F 1/133305 349/122 |
| 2007/0284991 A1* | 12/2007 | Egi | C09K 11/06 313/479 |
| 2008/0055831 A1* | 3/2008 | Satoh | G02F 1/133305 361/600 |
| 2014/0146279 A1* | 5/2014 | Kim | G02B 1/105 349/122 |
| 2015/0014644 A1 | 1/2015 | Namkung et al. | |

* cited by examiner

*Primary Examiner* — Lex Malsawma
(74) *Attorney, Agent, or Firm* — Lewis Roca Rothgerber Christie LLP

(57) ABSTRACT

A display device includes a display panel, and a protection film on the display panel and including a base film, and a plurality of protrusions on the base film.

14 Claims, 4 Drawing Sheets

DISPLAY DEVICE

CROSS-REFERENCE TO RELATED APPLICATION

This application claims priority to, and the benefit of, Korean Patent Application No. 10-2015-0113890, filed on Aug. 12, 2015, in the Korean Intellectual Property Office, the entire contents of which are incorporated herein by reference in their entirety.

BACKGROUND

1. Field

Embodiments of the present invention relate to a display device.

2. Description of the Related Art

With advancement of an information-oriented society, various display panels, such as an organic light emitting diode (OLED) panel, a liquid crystal display (LCD) panel, an electro-phoretic display (EPD) panel, and an electro-wetting display (EWD) panel, have been applied to display devices.

Recently, a display device that is thin, lightweight, highly portable, flexible, and foldable has been developed. A flexible substrate, such as plastic, instead of a rigid substrate, may be used in the display panel of the display device.

SUMMARY

An aspect of embodiments of the present invention provides a display device that is capable of preventing a dent defect of a display panel.

A display device according to an exemplary embodiment of the present invention includes a display panel, and a protection film on the display panel and including a base film, and a plurality of protrusions on the base film.

The protrusions may be on a surface of the base film opposite the display panel.

Widths of the protrusions may be about 10 µm to about 500 µm.

Heights of the protrusions may be about 1 to about 20 times the widths of the protrusions.

The heights of the protrusions may be less than about 500 µm.

A distance between adjacent ones of the protrusions may be about 3 to about 20 times the widths of the protrusions.

A distance between the adjacent ones of protrusions may be less than about 500 µm.

The protection film may be on a side of the display panel opposite to a surface of the display panel from which light is emitted.

The display panel may include a first substrate, a display element on the first substrate, and an encapsulation member configured to isolate the display element from an external environment.

The display element may include a first electrode, an organic layer on the first electrode, and a second electrode on the organic layer.

The encapsulation member may include a plurality of inorganic layers, and a plurality of organic layers alternately laminated with the plurality of inorganic layers, and a lowermost one of the inorganic layers may be on the display element.

A cross-section of one of the protrusions parallel to a surface of the base film may include at least one of a polygonal shape, a circular shape, or an oval shape.

The base film may include an elastic material.

The base film may include at least one of polyethylene terephthalate (PET), polyethylene naphthalate (PEN), polypropylene (PP), polycarbonate (PC), polystyrene (PS), polysulfone (Psul), ployethylene (PE), polyphthalamide (PPA), polyethersulfone (PES), polyarylate (PAR), or a modified polyphenylene oxide (MPPO).

The display device may further include an adhesive layer between the display panel and the protection film.

The display device of embodiments of the present invention may protect the display panel by including the protection film. Because the protection film includes a plurality of protrusions, the display device may prevent a dent defect of the display panel from being generated by the particles.

BRIEF DESCRIPTION OF THE DRAWINGS

Example embodiments will now be described more fully hereinafter with reference to the accompanying drawings, in which.

DETAILED DESCRIPTION

Figure 1:
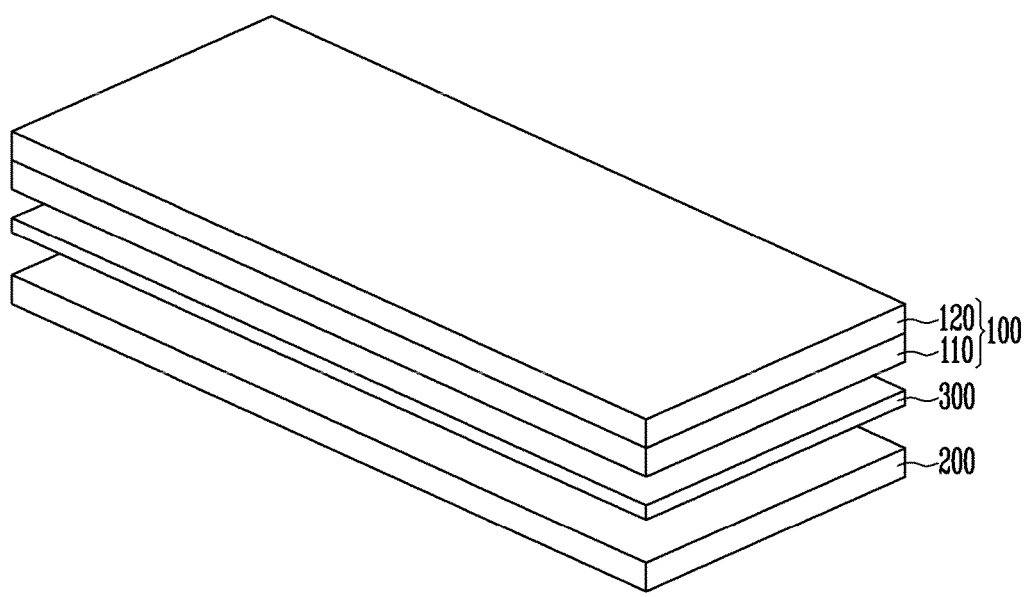
FIG. 1 is an exploded perspective view of a display device according to an exemplary embodiment of the present invention.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
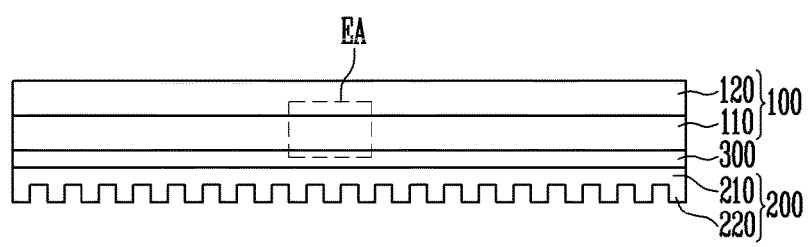
FIG. 2 is a cross-sectional view of the display device illustrated in FIG. 1.
Figure 3:
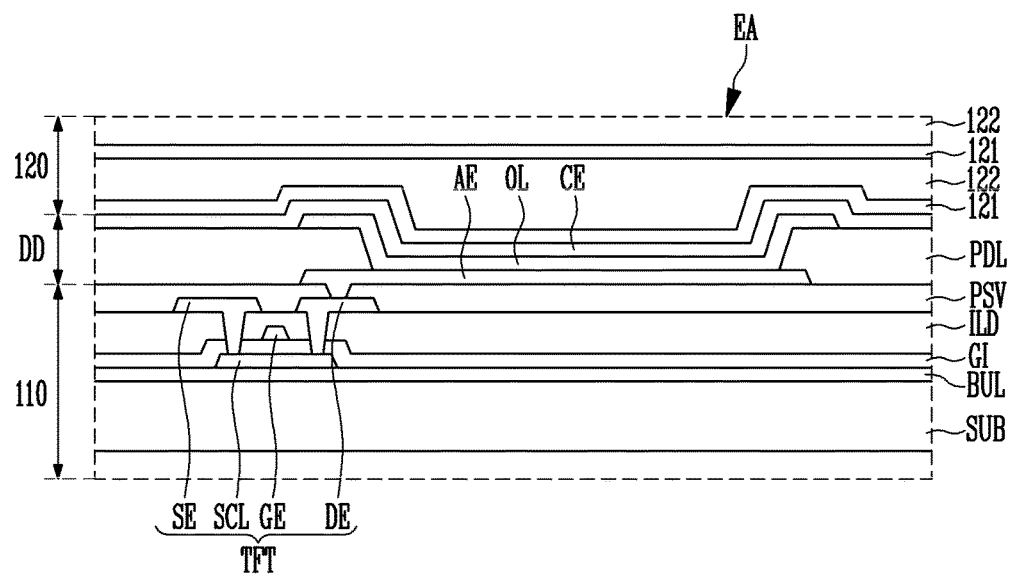
FIG. 3 is an enlarged view of the region EA of FIG. 2.

FIG. 1 is an exploded perspective view of a display device according to an exemplary embodiment of the present invention, FIG. 2 is a cross-sectional view of the display device illustrated in FIG. 1, and FIG. 3 is an enlarged view of the region EA of FIG. 2.

Referring to FIGS. 1 to 3, the display device may include a display panel 100, a protection film 200 at one surface of the display panel 100, and an adhesive layer 300 for bonding the display panel 100 to the protection film 200.

The display panel 100 is not limited to a specific type of display panel. For example, a self-emissive type of display panel, such as an organic light emitting diode (OLED) panel, may be used as the display panel 100. In addition, a non-emissive type of display panel, such as a liquid crystal display (LCD) panel, an electro-phoretic display (EPD) panel, and an electro-wetting display (EWD) panel, may be used as the display panel 100. When a non-emissive type of display panel is used as the display panel 100, the display device may include a backlight unit that is configured to provide light to the display panel 100. In the current exemplary embodiment, an OLED panel will be exemplarily described as the display panel 100.

The display panel 100 may include a thin film transistor (TFT) substrate 110, a display element DD on the TFT substrate 110, and an encapsulation member 120 separating the display element DD from an external environment.

The TFT substrate 110 may include a base substrate SUB, and at least one thin film transistor (TFT) on the base substrate SUB.

The base substrate SUB may transmit light because it may include a transparent insulating material. The base substrate SUB may be a rigid substrate. For example, the base substrate SUB may be one of a glass-based substrate, a quartz-based substrate, a glass and ceramic-based substrate, and a crystalline glass-based substrate.

The base substrate SUB may be a flexible substrate, and may be either one of a film-based substrate including a polymer organic material, or a plastic-based substrate. For example, the base substrate SUB may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), or cellulose acetate propionate (CAP). In addition, the base substrate SUB may include fiber glass reinforced plastic (FRP).

Further, materials that can be applied to the base substrate SUB during a manufacturing process of the display panel 100 may have resistance against a high processing temperature (or may have heat resistance).

A buffer layer BUL may be between the base substrate SUB and the thin film transistor (TFT). The buffer layer BUL may include at least one of a silicon oxide (SiOx) or a silicon nitride (SiNx). The buffer layer BUL may prevent permeation of moisture and oxygen into the semiconductor layer SCL of the thin film transistor (TFT). The buffer layer BUL may prevent impurities of the base substrate SUB from spreading to the semiconductor layer SCL. In addition, the buffer layer BUL may planarize a surface of the base substrate SUB.

The thin film transistor (TFT) may be connected to a gate line and to a data line. The thin film transistor (TFT) may include the semiconductor layer SCL, a gate electrode GE, a source electrode SE, and a drain electrode DE.

The semiconductor layer SCL may be located on the buffer layer BUL. The semiconductor layer SCL may include one of amorphous silicon (a-Si), polycrystalline silicon (poly Si), an oxide semiconductor, and an organic semiconductor. A region of the semiconductor layer SCL contacting the source electrode SE and the drain electrode DE may be source and drain regions in which impurities are doped or injected. A region between the source region and the drain region may be a channel region. In this case, the oxide semiconductor may include at least one of zinc (Zn), indium (In), gallium (Ga), tin (Sn), or a mixture thereof. For example, the oxide semiconductor may include indium-gallium-zinc oxide (IGZO).

Additionally, a light blocking layer may be located above or below the semiconductor layer SCL to prevent light from entering the semiconductor layer SCL.

A gate insulating layer GI may be located on the semiconductor layer SCL. The gate insulating layer GI may cover the semiconductor layer SCL, and may insulate the semiconductor layer SCL from the gate electrode GE. The gate insulating layer GI may include at least one of a silicon oxide (SiOx) and a silicon nitride (SiNx).

The gate electrode GE may be located on the gate insulating layer GI. The gate electrode GE may be connected to the gate line. For example, a part of the gate line may protrude to form the gate electrode GE. The gate electrode GE may overlap the semiconductor layer SCL. The gate electrode GE may include a low resistance conductive material.

An interlayer insulating layer ILD may be located on the gate electrode GE. The interlayer insulating layer ILD may include the same material as the gate insulating layer GI. That is, the interlayer insulating layer ILD may include at least one of a silicon oxide (SiOx) and a silicon nitride (SiNx).

The source electrode SE and the drain electrode DE may be located on the interlayer insulating layer ILD while being separated from each other. The source electrode SE and the drain electrode DE may include a low resistance conductive material, and may be insulated from the gate electrode GE by the interlayer insulating layer ILD. In addition, the source electrode SE and the drain electrode DE may be respectively connected to the source region and the drain region. The source electrode SE may be connected to the data line. For example, a part of the data line may protrude to form the source electrode SE.

Meanwhile, in the current exemplary embodiment, the thin film transistor having a top gate structure has been exemplarily described, although the present invention is not limited thereto. For example, the thin film transistor may have a bottom gate structure.

A passivation layer PSV may be disposed above the base substrate SUB on which the thin film transistor is located. That is, the passivation layer PSV may cover the thin film transistor. In addition, a part of the passivation layer PSV may be removed to expose a part of the drain electrode DE.

The passivation layer PSV may include at least one layer. For example, the passivation layer PSV may include an inorganic passivation layer, and may further include an organic passivation layer on the inorganic passivation layer. The inorganic passivation layer may include at least one of a silicon oxide (SiOx) or a silicon nitride (SiNx). The organic passivation layer may include one of acryl, polyimide (PI), polyamide (PA), and benzocyclobutene (BCB). In addition, the organic passivation layer may be a planarization layer for planarizing protrusions and depressions therebelow, because the organic passivation layer is transparent and has fluidity.

The display element DD connected to the drain electrode DE may be disposed on the passivation layer PSV, and may be an organic light emitting element. The display element DD may include a first electrode AE connected to the drain electrode DE, an organic layer OL on the first electrode AE, and a second electrode CE on the organic layer OL.

One of the first electrode AE and the second electrode CE may be an anode, while the other may be a cathode. For example, the first electrode AE may be an anode, while the second electrode CE may be a cathode.

In addition, at least one of the first electrode AE and the second electrode CE may be a transmissive electrode. For example, when the display element DD is a bottom emission type of organic light emitting element, the first electrode AE may be a transmissive electrode, and the second electrode CE may be a reflective electrode. Alternatively, when the display element DD is a top emission type of organic light emitting element, the first electrode AE may be a reflective electrode, and the second electrode CE may be a transmissive electrode. In addition, when the display element DD is a dual emission type of organic light emitting element, the first electrode AE and the second electrode CE may both be a transmissive electrode. In the current exemplary embodiment, a case in which the first electrode AE is an anode and the display element DD is a top emission type of organic light emitting element will be described.

The first electrode AE may be located on the passivation layer PSV. The first electrode AE may include a reflective layer that is configured to reflect light, and a first transparent conductive layer that is disposed above or below the reflective layer. At least one of the first transparent conductive layer and the reflective layer may be connected to the drain electrode DE.

The reflective layer may include a material that can reflect light. For example, the reflective layer may include at least one of aluminum (Al), silver (Ag), chromium (Cr), molybdenum (Mo), platinum (Pt), nickel (Ni), or alloys of these metals.

The first transparent conductive layer may include a transparent conductive oxide. For example, the first transparent conductive layer may include at least one of transparent conductive oxides such as indium tin oxide (ITO), indium zinc oxide (IZO), aluminum zinc oxide (AZO), gallium-doped zinc oxide (GZO), zinc tin oxide (ZTO), gallium tin oxide (GTO), or fluorine-doped tin oxide (FTO).

A pixel defining layer PDL may be located on the first electrode AE, and may expose the first electrode AE. The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), a heterocyclic polymer, parylene, an epoxy resin, benzocyclobutene (BCB), a siloxane-based resin, or a silane-based resin.

The organic layer OL may have a multi-layered thin film structure that includes at least one emitting layer EML. For example, the organic layer OL may include a hole injection layer (HIL) in which holes are injected, a hole transport layer (HTL) in which mobility of holes is increased and in which movement of electrons is suppressed to increase the likelihood of recombination of holes and electrons otherwise failing to combine in the emission layer EML, the emission layer EML in which the injected electrons and holes are recombined to emit light, a hole blocking layer (HBL) for suppressing movement of holes failing to combine with electrons in the emission layer EML, an electron transport layer (ETL) for smoothly transporting electrons to the emission layer EML and an electron injection layer (EIL) in which electrons are injected.

A color of light generated from the emission layer may be one of red, green, blue, and white, although the present invention is not limited thereto. For example, a color of light generated from the emission layer of the organic layer OL may be one of magenta, cyan, and yellow.

The second electrode CE may be located on the organic layer OL, and may include a transflective layer on the organic layer OL, and a second transparent conductive layer on the transflective layer.

The transflective layer may transmit light. For example, the transflective layer may be a thin metal layer that is thin enough to transmit light. In addition, the transflective layer may include a material that has a lower work function than the first transparent conductive layer. For example, the transflective layer may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), nickel (Li), calcium (Ca), or an alloy thereof. A voltage drop may occur due to the transflective layer being a thin film metal layer through which light is transmitted.

The second transparent conductive layer may reduce or prevent a voltage drop (IR-Drop) of the transflective layer, and may transmit light that is transmitted through the transflective layer. In this case, the second transparent conductive layer may include the same material as the first transparent conductive layer. That is, the second transparent conductive layer may be a conductive layer including one of transparent conductive oxides, such as indium tin oxide (ITO), indium zinc oxide (IZO), aluminum zinc oxide (AZO), gallium-doped zinc oxide (GZO), zinc tin oxide (ZTO), gallium tin oxide (GTO), or fluorine-doped tin oxide (FTO).

Meanwhile, light emitted from the organic layer OL might not be transmitted through the transflective layer, but may instead be reflected therefrom. Light reflected from the transflective layer may be reflected again from the reflective layer. That is, the light emitted from the organic layer OL may be resonated between the reflective layer and the transflective layer. Light extraction efficiency of the display element DD may be improved by resonance of the light.

In addition, a distance between the reflective layer and the transflective layer may vary depending on a color of emitted light. That is, depending on the color of the emitted light from the organic layer OL, the distance between the reflective layer and the transflective layer may be adjusted in accordance with a resonance condition.

The encapsulation member 120 may isolate the display element DD from an external environment. In addition, the encapsulation member 120 may be located on the second electrode CE to prevent permeation of moisture and oxygen into the display element DD.

The encapsulation member 120 may be an encapsulation layer including a plurality of inorganic layers 121 and a plurality of organic layers 122 that cover the display element DD. The lowermost one of the inorganic layers 121 may be located on the display element DD. The inorganic layers 121 and the organic layers 122 may be alternately laminated, respectively.

The inorganic layers 121 may include at least one of silicon oxide (SiOx), silicon nitride (SiNx), silicon oxynitride (SiON), aluminum oxide (Al2O3), titanium oxide (TiO2), zirconium oxide (ZrOx), or tin oxide (ZnO). The organic layers 122 may include at least one of an epoxy resin, an acrylate resin, and a urethane acrylate resin. In addition, the organic layers 122 may remove a step that is caused by the display element DD.

Meanwhile, the encapsulation member 120 may be an opposing substrate that faces the first substrate 110, and may include the same material as the base substrate SUB. The encapsulation member 120 may be bonded to the first substrate 110 by a sealant.

In addition, a filler may be disposed in a space between the first substrate 110 and the encapsulation member 120. The filler may prevent the display element DD from being damaged by an external impact. In addition, when the filler has the ability to absorb moisture, the filler may prevent moisture from permeating into the display element DD by absorbing moisture that would otherwise permeate into the display element DD from the encapsulation member 120.

The protection film 200 may be located on at least one surface of the display panel 100. For example, the protection film 200 may be on a surface of the display panel 100 in a direction opposite to a direction toward which light is emitted. That is, the protection film 200 may be attached to an external surface of the base substrate SUB via the adhesive layer 300. In addition, the protection film 200 may include a base film 210, and the plurality of protrusions 220 at one surface of the base film 210.

The adhesive layer 300 may bond the display panel 100 to the protection film 200. The adhesive layer 300 may have an adhesive property, and may include a transparent polymer resin that can be cured by light, heat, or pressure.

Figure 4:
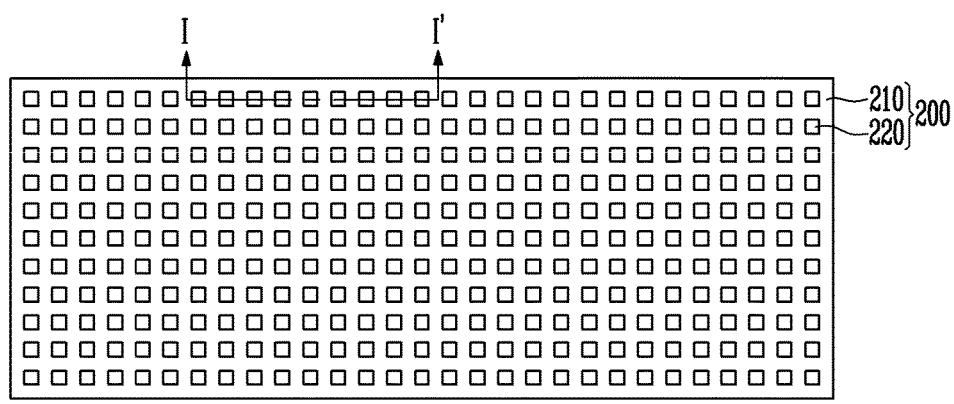
FIGS. 4 to 7 are top plan views of embodiments of a protection film shown in FIGS. 1 to 3.
Figure 9:
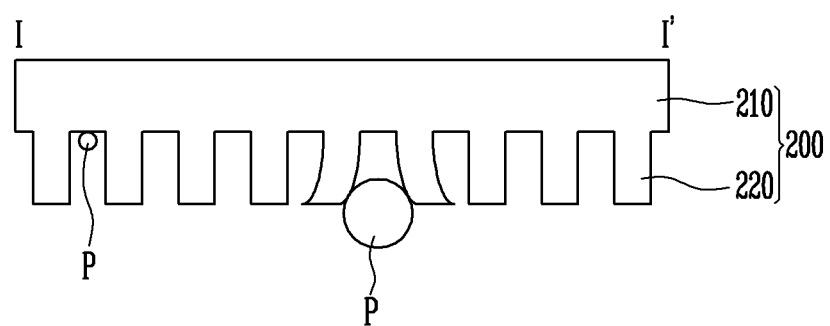
FIG. 9 is a schematic view illustrating how a display panel is protected by the protection film.

FIGS. 4 to 7 are top plan views of embodiments of the protection film shown in FIGS. 1 to 3, FIG. 8 is a cross-sectional view of FIG. 4 taken along the line I-I', and FIG. 9 is a schematic view illustrating how the display panel is protected by the protection film.

Referring to FIGS. 4 to 9, the protection film 200 may be located on at least one surface of the display panel 100 to protect the display panel 100. For example, the protection film 200 may protect the display panel 100 by absorbing an external impact applied to the display panel 100. In addition, the protection film 200 may prevent a dent defect of the display panel 100 that is otherwise generated by particles P. A dent defect may be generated by a pressure locally applied to the display panel 100 by the particles P such that the display panel 100 is deformed, thereby potentially resulting in some faulty pixels of the display panel 100. The dent defect generated by the particles P may occur during a manufacturing process of the display panel 100. Generally, the particles P, which are present inside manufacturing equipment used to manufacture the display panel 100, may have a diameter or size of several μm to several hundred μm.

The protection film 200 may include a base film 210, and a plurality of protrusions 220 located on at least one surface of the base film 210.

The base film 210 may absorb an external impact applied to the display panel 100 by including a material having an elastic property for absorbing the external impact. For example, the base film 210 may include at least one of polyethylene terephthalate (PET), polyethylene naphthalate (PEN), polypropylene (PP), polycarbonate (PC), polystyrene (PS), polysulfone (Psul), ployethylene (PE), polyphthalamide (PPA), polyethersulfone (PES), polyarylate (PAR), or a modified polyphenylene oxide (MPPO).

A thickness of the base film 210 may be about 20 μm to about 500 μm. When the thickness of the base film 210 is less than about 20 μm, the base film 210 might not sufficiently absorb the external impact. In addition, when the thickness of the base film 210 exceeds about 500 μm, the display panel 100 might not be able to be smoothly bent due to the protection film 200.

The protrusions 220 may be located on at least one of surfaces of the base film 210 in a direction away from the display panel 100. That is, the protrusions 220 may protrude outward from the surface of the base film 210, and may include the same material as the base film 210.

Figure 5:
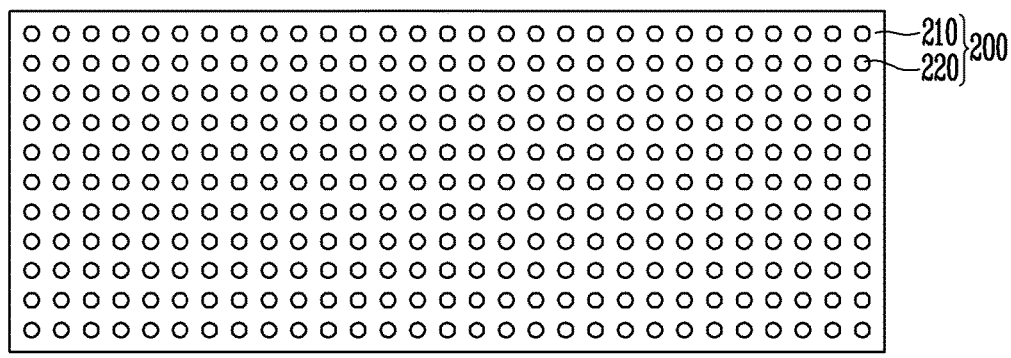
Figure 6:
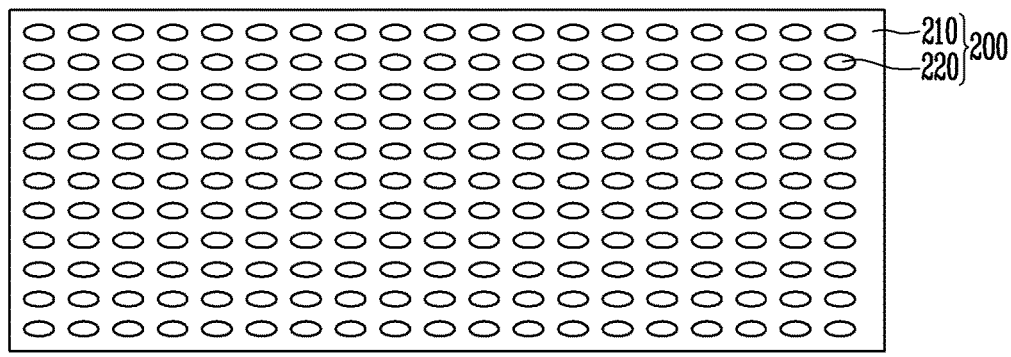
Figure 7:
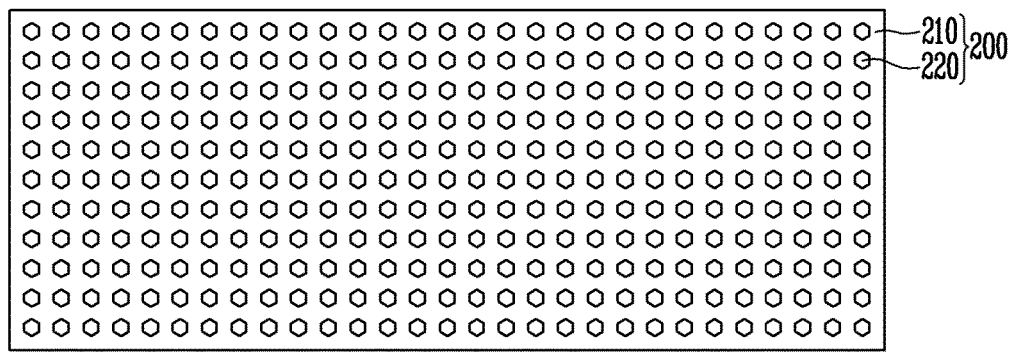
Figure 8:
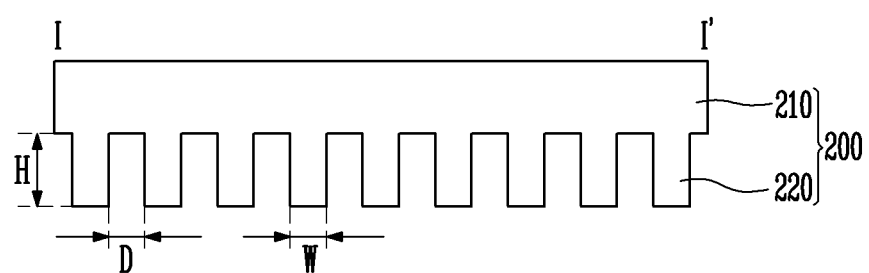
FIG. 8 is a cross-sectional view of FIG. 4 taken along the line I-I'.

As shown in FIGS. 4 to 7, cross-sections of the protrusions 220 parallel to the surface of the base film 210 may have at least one of a polygonal shape, a circular shape, and an oval shape. For example, as shown in FIG. 4, cross-sections of the protrusions 220 may have a quadrangular shape. As shown in FIG. 5, cross-sections of the protrusions 220 may have a circular shape. As shown in FIG. 6, cross-sections of the protrusions 220 may have an oval shape. As shown in FIG. 7, cross-sections of the protrusions 220 may have a hexagonal shape.

Widths W of the protrusions 220 may be about 10 μm to about 500 μm. A distance from the surface of the base film 210 on which the protrusions 220 are positioned to a terminal end of the protrusion 220 (i.e., a height H of the protrusions 220) may be about 1 to about 20 times the widths W of the protrusions 220. In this case, the heights H of the protrusions 220 may be less than about 500 μm.

A distance D between adjacent ones of the protrusions 220 may be about 3 to about 20 times the widths W of the protrusions 220. In this case, the distance D between the adjacent protrusions 220 may be less than about 500 μm.

As shown in FIG. 9, when a diameter or size of the particles P is smaller than the heights H of the protrusions 220, and is smaller than the distance D between the adjacent protrusions 220, the particles P may be located in a space between the adjacent protrusions 220. Accordingly, the protection film 200 may prevent the dent defect of the display panel 100 from being generated by the particles P.

In addition, when the diameter or size of the particles P is greater than the distance D between the adjacent protrusions 220, the protrusions 220 may be curved to prevent the particles P from applying a pressure toward the display panel 100. Accordingly, the protection film 200 may prevent a dent defect of the display panel 100 from being generated by the particles P.

Meanwhile, when widths W of the protrusions 220 are less than about 10 μm, when heights H of the protrusions 220 are smaller than the widths W of the protrusions 220, and when a distance D between the adjacent protrusions 220 is less than about 3 times the widths W of the protrusions 220, it may be difficult to prevent a dent defect of the display panel 100 from being generated by the particles P having a diameter or size of about 100 μm or more.

When the widths W of the protrusions 220 exceed about 500 μm, the particles P having a diameter or size of about 100 μm to about 500 μm may be attached onto the surfaces of the protrusions 220. Accordingly, the particles P attached to the surfaces of the protrusions 220 may directly apply a pressure to the protection film 200. Accordingly, the dent defect of the display panel 100 may be generated.

When a distance D between the adjacent protrusions 220 is less than about 20 times the widths W of the protrusions 220 and when heights H of the protrusions 220 is more than about 20 times the widths W of the protrusions 220, the protrusions 220 may contact each other by bending of the display panel 100. When the protrusions 220 contact each other by the bending of the display panel 100, one of the adjacent protrusions 220 (hereinafter referred to as a "first protrusion") may deliver a pressure associated with the bending to the other of the adjacent protrusions 220 (hereinafter referred to as a "second protrusion"). However, the second protrusion may deliver the pressure to the first protrusion in response to the pressure associated with the bending. Accordingly, the display panel 100 might not be smoothly bent due to the protection film 200. In addition, when the display panel 100 is bent, the protection film 200 may be deformed by a pressure associated with action and reaction of the first and second protrusions 220.

When a distance D between the adjacent protrusions 220 exceeds about 20 times the widths W of the protrusions 220, most of the particles P may be disposed in a space between the adjacent protrusions 220. However, when the protrusions 220 are deformed by the external pressure, some of the particles P having a larger diameter or size than the height H of the protrusions 220 may directly apply pressure to the base film 210. Accordingly, the base film 210 may receive the pressure only locally by the particle P, and the locally applied pressure may cause a dent defect of the display panel 100.

As described above, the protection film 200 may protect the display panel 100 by absorbing the external impact applied to the display panel 100. In addition, the protection film 200 may prevent the particles P, which are present in the manufacturing equipment for manufacturing the display panel 100, from being directly attached to the display panel 100, and may prevent a dent defect of the display panel 100 from being generated by the particles P.

Example embodiments have been disclosed herein and although specific terms are employed, they are used and are to be interpreted in a generic and descriptive sense only and not for purpose of limitation. In some instances, as would be apparent to one of ordinary skill in the art as of the filing of the present application, features, characteristics and/or elements described in connection with a particular embodiment may be used singly or in combination with features, characteristics and/or elements described in connection with other embodiments unless otherwise specifically indicated. Accordingly, it will be understood by those of skill in the art that various changes in form and details may be made without departing from the spirit and scope of the present invention as set forth in the following claims and their equivalents.

What is claimed is:

1. A display device comprising:
a display panel comprising:
   a first substrate;
   a display element on the first substrate; and
   an encapsulation member configured to isolate the display element from an external environment; and
a protection film on the display panel such that the display element is between the encapsulation member and the protection film, and comprising:
   a base film; and
   a plurality of protrusions on the base film.

2. The display device of claim 1, wherein the protrusions are on a surface of the base film opposite the display panel.

3. The display device of claim 2, wherein widths of the protrusions are about 10 µm to about 500 µm.

4. The display device of claim 3, wherein heights of the protrusions are about 1 to about 20 times the widths of the protrusions.

5. The display device of claim 4, wherein the heights of the protrusions are less than about 500 µm.

6. The display device of claim 3, wherein a distance between adjacent ones of the protrusions is about 3 to about 20 times the widths of the protrusions.

7. The display device of claim 6, wherein a distance between the adjacent ones of protrusions is less than about 500 µm.

8. The display device of claim 3, wherein the protection film is on a side of the display panel opposite to a surface of the display panel from which light is emitted.

9. The display device of claim 1, wherein the display element comprises:
   a first electrode;
   an organic layer on the first electrode; and
   a second electrode on the organic layer.

10. The display device of claim 9, wherein the encapsulation member comprises:
   a plurality of inorganic layers; and
   a plurality of organic layers alternately laminated with the plurality of inorganic layers,
   wherein a lowermost one of the inorganic layers is on the display element.

11. The display device of claim 1, wherein a cross-section of one of the protrusions parallel to a surface of the base film comprises at least one of a polygonal shape, a circular shape, or an oval shape.

12. The display device of claim 1, wherein the base film comprises an elastic material.

13. The display device of claim 12, wherein the base film comprises at least one of polyethylene terephthalate (PET), polyethylene naphthalate (PEN), polypropylene (PP), polycarbonate (PC), polystyrene (PS), polysulfone (Psul), ployethylene (PE), polyphthalamide (PPA), polyethersulfone (PES), polyarylate (PAR), or a modified polyphenylene oxide (MPPO).

14. The display device of claim 1, further comprising an adhesive layer between the display panel and the protection film.

* * * * *